United States Patent
Fan et al.

(10) Patent No.: US 6,950,771 B1
(45) Date of Patent: Sep. 27, 2005

(54) CORRELATION OF ELECTRICAL TEST DATA WITH PHYSICAL DEFECT DATA

(75) Inventors: Yuezhen Fan, San Jose, CA (US); Jason Xu, San Jose, CA (US); Stephen Wing-Ho Tang, San Jose, CA (US); Zhi-Min Ling, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 85 days.

(21) Appl. No.: 10/732,493

(22) Filed: Dec. 9, 2003

(51) Int. Cl.$^7$ .............................................. G01R 31/00
(52) U.S. Cl. ...................... 702/117; 714/723; 714/724; 714/725
(58) Field of Search ........................... 702/117, 33, 35, 702/36, 81, 82, 84

(56) References Cited

U.S. PATENT DOCUMENTS

2003/0046621 A1 * 3/2003 Finkler et al. .............. 714/723

OTHER PUBLICATIONS

Chan Huan Gim, Jul. 8-12, 2002, Motorola Malaysia, "Physical and Failure Analysis of Integrated Circuits", pp. 105-109.*

* cited by examiner

Primary Examiner—John Barlow
Assistant Examiner—Cindy D. Khuu
(74) Attorney, Agent, or Firm—LeRoy D. Maunu

(57) ABSTRACT

Method and apparatus are disclosed for analyzing defect data produced in testing a semiconductor chip from a logic design. In various embodiments, input for processing is a first inspection data set that identifies a first set of physical locations that are associated with defects detected during fabrication of the chip. Also input is a second test data set that includes one or more identifiers associated with failing circuitry in the chip. A second set of physical locations is determined from the one or more identifiers of failing circuitry, hierarchical relationships between blocks of the design, and placement information associated with the blocks. Each of the one or more identifiers is associated with at least one of the blocks. Correspondences are identified between physical locations in the first inspection data set and the second set of physical locations.

16 Claims, 6 Drawing Sheets

CORRELATION OF ELECTRICAL TEST DATA WITH PHYSICAL DEFECT DATA

FIELD OF THE INVENTION

The present invention relates in general to semiconductor chip defect analysis.

BACKGROUND OF THE INVENTION

Semiconductor chip manufacturing requires defect analysis to help improve chip yield and monitor the production environment. Semiconductor chips are tested for the presence of physical defects at various processing steps during the manufacturing process. "In-line" measurements occur while the semiconductor chips are within the fabrication facility. Example physical defects include pinholes, voids, spikes, or agglomerations. With the aid of defect data analysis, equipment failure or fabrication facility contamination may be inferred.

Electrical measurements may be taken and further analysis performed after completing manufacture of the semiconductor chip. The electrical measurements, which produce electrical test data, or "electrical data" for short, and analysis may help improve chip yield and provide information in support of monitoring the production environment. The electrical data and analysis also support monitoring of device and circuit-level functional characteristics. Poor device or circuit-level functional characteristics may be caused by physical defects. However, physical defects may be difficult to detect after manufacture of the chip is complete.

Correlation of physical defects with electrical data may be performed through failure analysis of a limited sample size of failing chips. However, failure analysis techniques may be time consuming, expensive, and destructive. Semiconductor manufacturers have short production-cycle times that do not permit the frequent use of failure analysis techniques. The present invention may address one or more of these and related issues.

SUMMARY OF THE INVENTION

The various embodiments of the invention may be used for analyzing defect data produced in testing a semiconductor chip from a logic design. In various embodiments, input for processing is a first (inspection) data set that identifies a first set of physical locations that are associated with defects detected during fabrication of the chip. Also input is a second test data set that includes one or more identifiers associated with failing circuitry in the chip. A second set of physical locations is determined from the one or more identifiers of failing circuitry, hierarchical relationships between blocks of the design, and placement information associated with the blocks. Each of the one or more identifiers is associated with at least one of the blocks. Correspondences are identified between physical locations in the first (inspection) data set and the second set of physical locations.

Various methods are disclosed for analyzing yield data produced in testing a semiconductor chip. The electrical data is translated into a physical location defect data format that may be overlaid with the physical defect data. Physical defect data may be compared with translated electrical data to improve yield analysis.

The above summary of the present invention is not intended to describe each illustrated embodiment or implementation of the present invention. This is the purpose of the figures and the associated discussion which follows.

DETAILED DESCRIPTION

Figure 1:
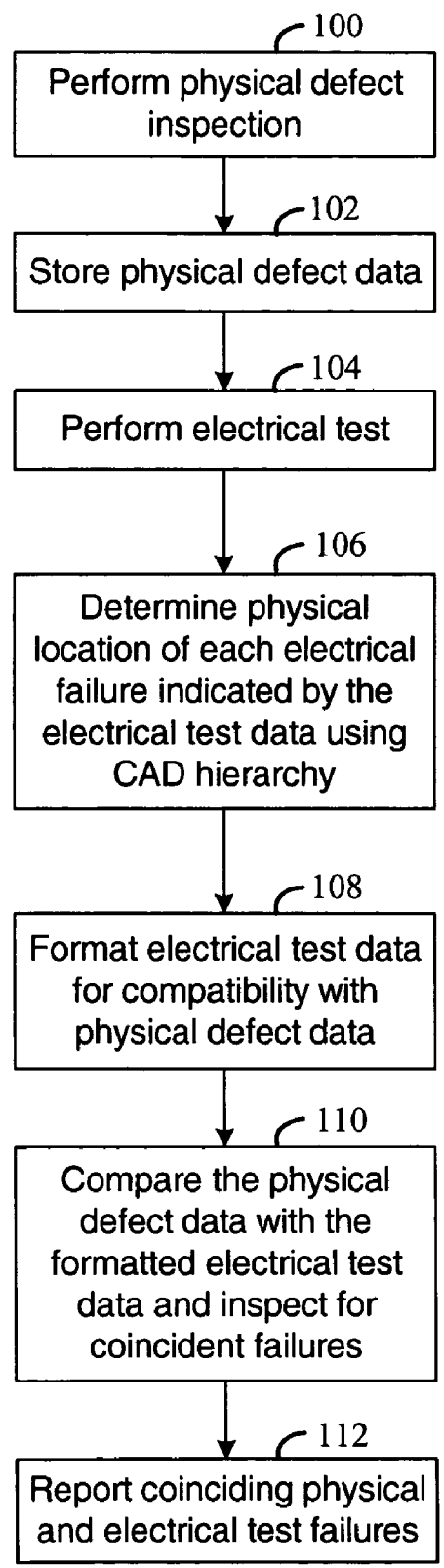
FIG. 1 is a flowchart of an example process for analyzing data generated in testing a semiconductor chip in accordance with various embodiments of the present invention.

FIG. 1 is a flowchart of an example process for analyzing data generated in testing a semiconductor chip in accordance with various embodiments of the invention. During manufacture of the chip, various inspections are performed in an attempt to find physical defects (step 100). This process may be referred to as "in-line" inspection. Various known techniques may be used to inspect the chip. For example, inspection techniques that use an electron/ion beam, lasers, or various other optical apparatus may be used for physical inspection. Data gathered during in-line inspection and associated with physical defects are stored for later analysis (step 102).

Electrical testing may be performed at some time after manufacture of the chip is complete and test data generated from the testing is stored for subsequent analysis (step 104). Data associated with a failure(s) detected during electrical testing are analyzed to determine the physical location(s) of failing circuit elements (step 106). In one embodiment, the physical location(s) of circuitry failing the electrical test is determined from a hierarchical description of the design.

The data indicating the physical location(s) of the electrical test failure(s) are then formatted for ease of cross-reference with the physical defect data (step 108). For example, for a given output of a numbered bus, data associated with a memory cell failure may be recorded in a format such as: cycle#, vector#, data(LSB to MSB). This data is converted into logic address data such as: block#, major-row#, minor-row#, column#. Block # is a number assigned to the logic block by the logic design, (not shown). A block has many major rows, each major row has multiple minor rows. A minor row # indicates one specific row, a major row # indicates a group of minor rows. The logic address data may then be translated into the x-y position on the die (based on CAD information) such that the collection of data for the given output is: lot#, wafer#, wafer-relative x-position of the die, wafer-relative y-position of the die, block#, major-row#, minor-row#, column#, die-relative x-position of the failure, die-relative y-position of the failure, and classification. The classification may indicate, for example, a single bit failure, failure of dual bits, failure of a data line, or failure of a word line, etc.

The physical defect data and the re-formatted electrical test data are then compared to detect failures that occur at the same die-relative x and y positions (step 110). It will be appreciated that different embodiments may allow different variances between physical defect coordinates and the electrical test defect coordinates in determining that the positions of the physical defect coordinates and the electrical test defect coordinates are the same. Any coinciding physical defect coordinates and electrical test defect coordinates are reported to the user (step 112).

Figure 2:
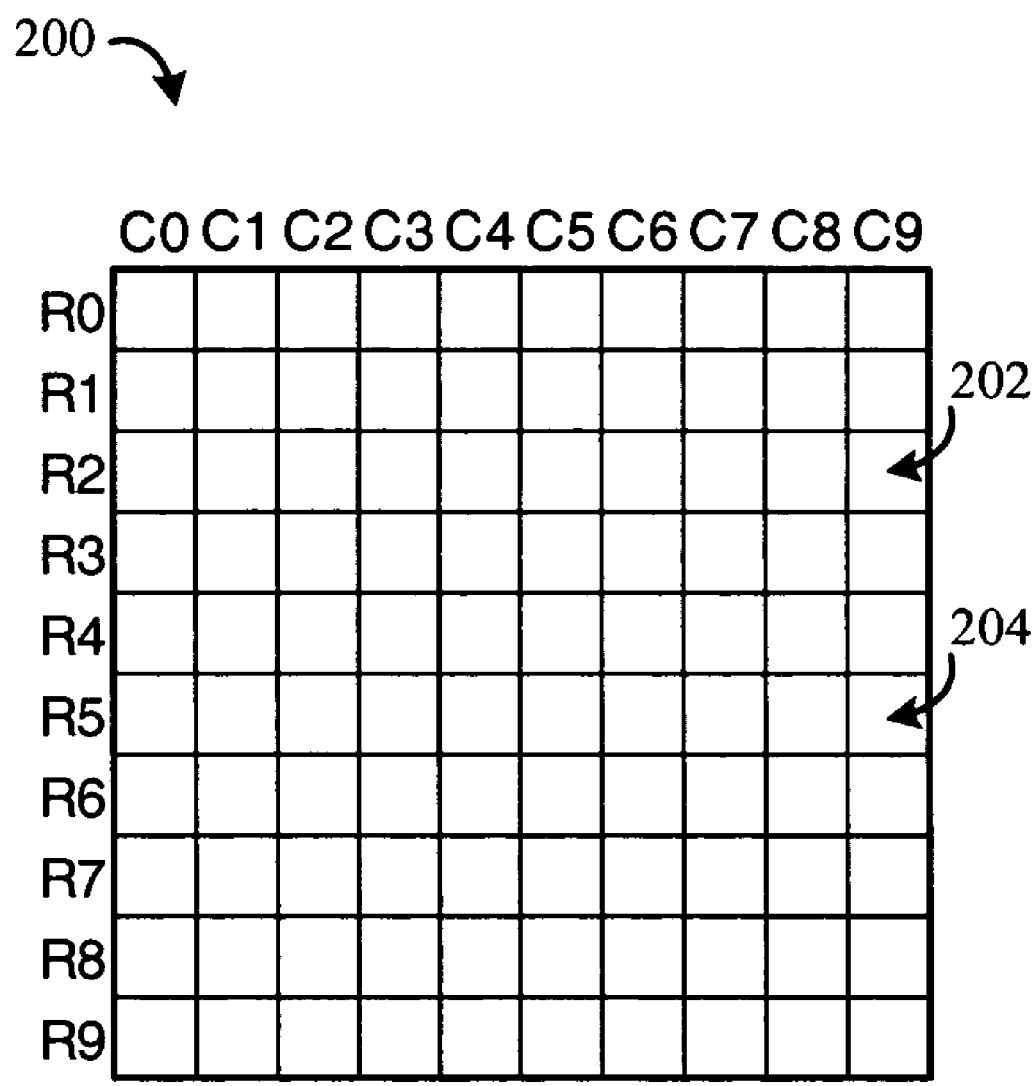
FIG. 2 illustrates a semiconductor chip comprised of an array of memory cells.
Figure 3:
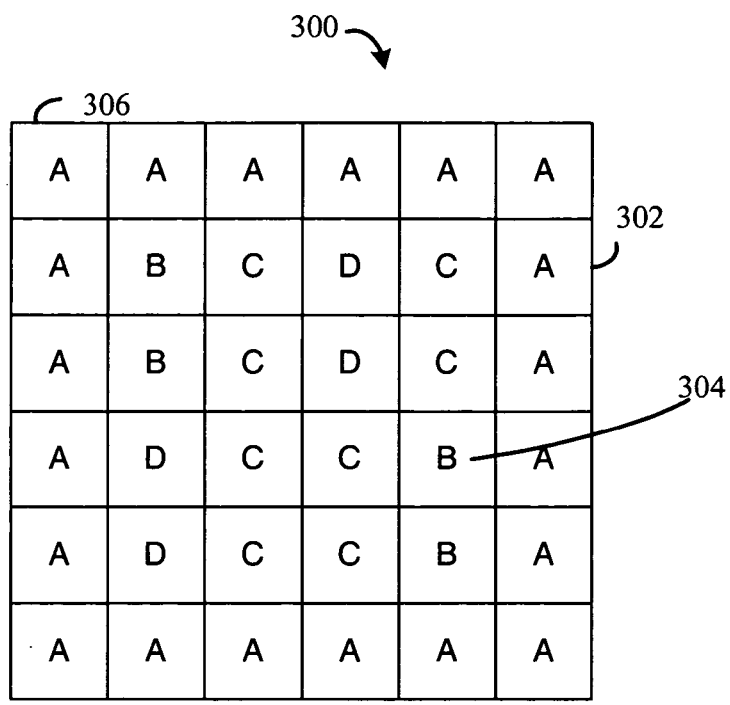
FIG. 3 illustrates an example of a semiconductor chip comprised of circuit blocks of a programmable logic device.
Figure 4:
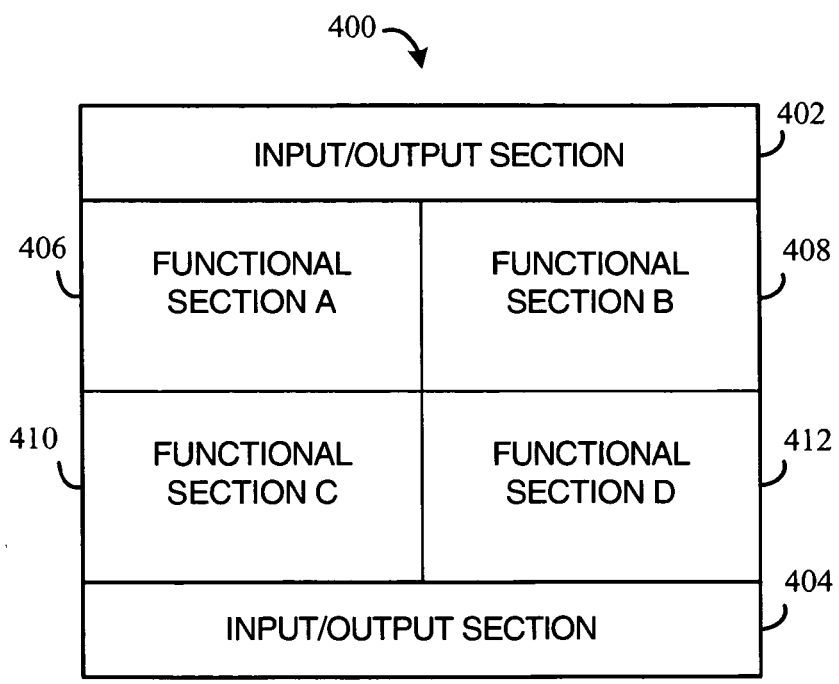
FIG. 4 illustrates an example of an ASIC layout on a semiconductor chip.

FIGS. 2, 3, and 4 illustrate different types of integrated circuits for which the various embodiments of the invention may be used. FIG. 2 illustrates an example of the layout of cells of a memory chip; FIG. 3 illustrates an example of the layout of blocks of a programmable logic device; and FIG. 4 illustrates an example of the layout of an ASIC. The embodiments of the invention may be used to correlate physical defect data and electrical test data from less complex circuit layouts such as memory chips to more complex layouts such as ASICs.

FIG. 2 illustrates a semiconductor chip 200 comprised of an array of memory cells. The dimensions of each memory cell are uniform and are arranged in rows R0–R9 and columns C0–C9. For example, cell 202 at R2, C9 and cell 204 at R5, C9 are the same size. The pattern of equal-sized memory cells permits a straightforward determination of the physical position of electrical defects and thereafter correlation with physical defects.

For circuit designs having an irregular layout of circuitry, determining the physical position of electrical defects may be problematic. For example, programmable logic devices (PLDs) such as field programmable gate arrays (FPGAs) have different types of circuit blocks, with blocks of each type containing physically equivalent circuitry. However, determining the position of circuit elements within the blocks on the chip requires more than the straightforward calculation that may be performed for memory cells. Determining the physical position of the circuitry that fails an electrical test in an ASIC may be even more problematic. FIGS. 3 and 4 illustrate examples of layouts of a programmable logic device and an ASIC, respectively.

FIG. 3 illustrates an example of a semiconductor chip 300 comprised of circuit blocks of a programmable logic device. Blocks of the same type have the same functionality. For example, the A blocks (such as block 302) may be input/output blocks, and the B blocks (such as block 304) may be configurable logic blocks.

Even with identical functionality, however, the position of a block on the chip may dictate the physical layout of the circuitry within that block. Thus, two blocks of the same type do not necessarily have the same physical layout. For example, the layout of the circuitry within A-type block 302 may be different from the layout of an A-type block on another side of the chip, such as block 306. It will be further appreciated that blocks of different types will have different circuit layouts. These characteristics make difficult determining the physical position of circuitry that fails an electrical test.

FIG. 4 illustrates an example of an ASIC layout on a semiconductor chip. The ASIC 400 includes input/output sections 402 and 404 and functional sections 406, 408, 410, and 412. The functional sections have circuitry that implements different functional features of the ASIC. The layout of the circuitry is likely to vary between the I/O sections 402 and 404, as well as between the functional circuit sections 406, 408, 410, and 412.

The different types of blocks and the irregular layout of an ASIC makes difficult determining the locations of electrical test failures. As compared to an array of memory cells, the layout of an ASIC has no pattern from which positions of circuit elements may be determined.

Figure 5A:
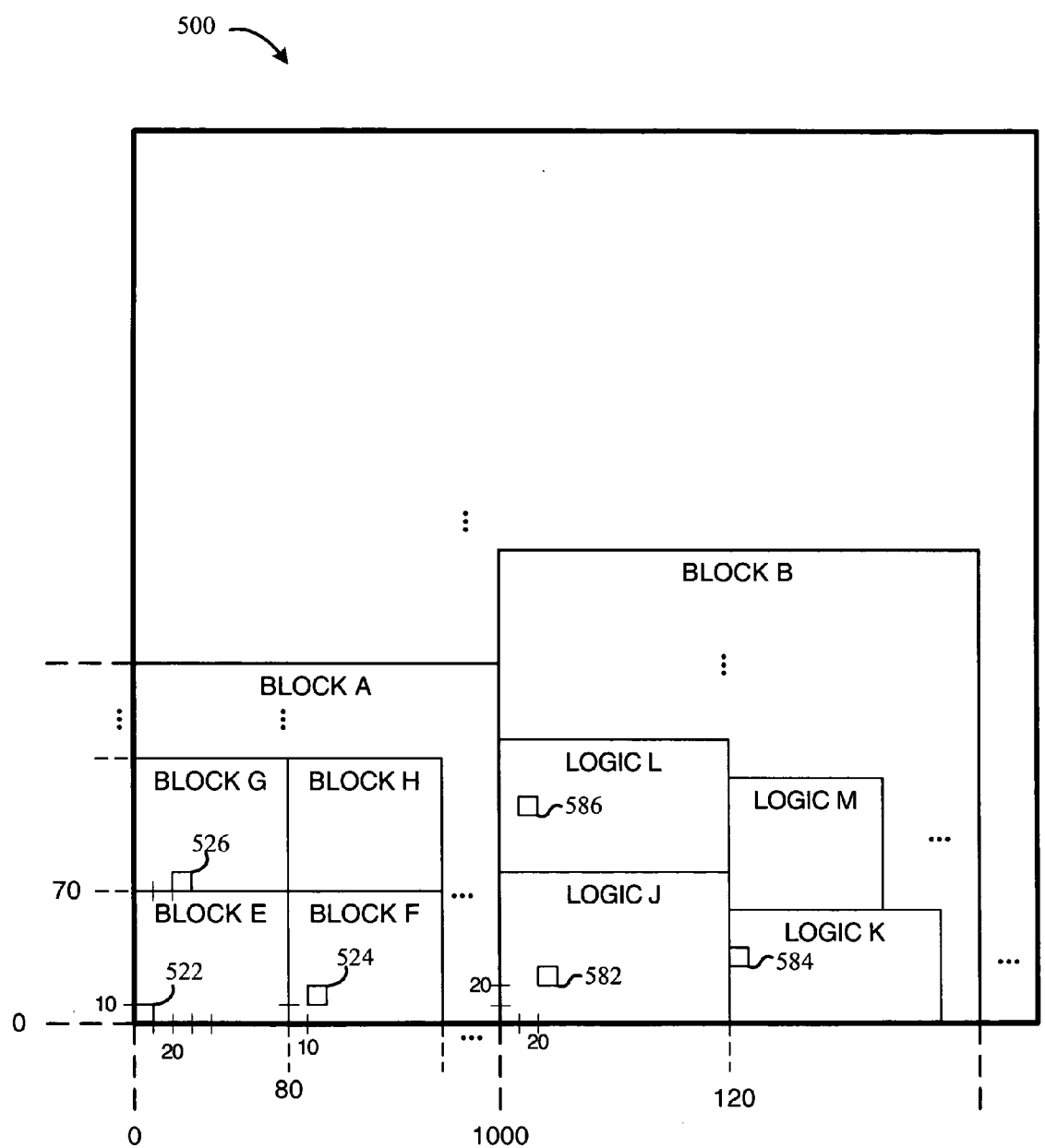
FIG. 5A illustrates an example layout of various blocks on a semiconductor chip.
Figure 5B:
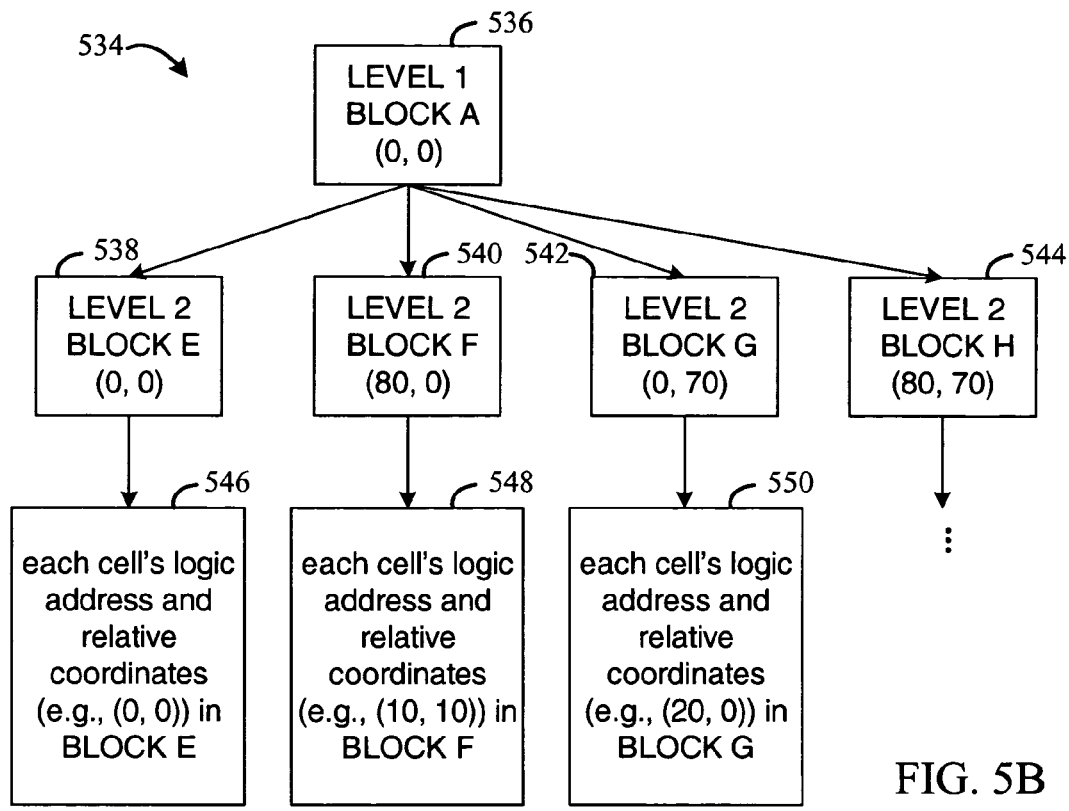
FIG. 5B illustrates an example of a hierarchy of blocks for block A of FIG. 5A down to the level of associated memory cells.
Figure 5C:
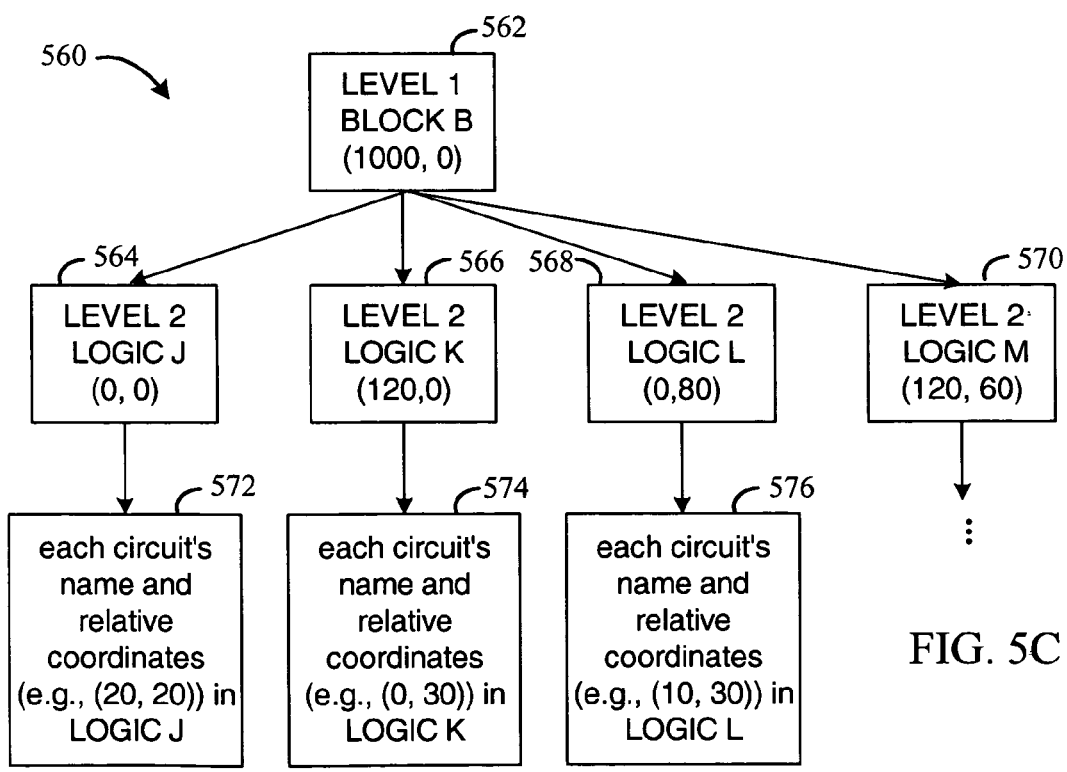
FIG. 5C illustrates the hierarchy of blocks related to example block B of FIG. 5A down to the level of failing circuit paths.

The various embodiments of the invention correlate failures identified in electrical testing with physical defects found from in-line inspection. The defect data may be correlated for circuits with layouts that form a repetitive pattern, as well as for layouts without a repetitive pattern. FIGS. 5A, 5B, and 5C illustrate how the design information from a CAD tool (not shown) may be used to determine the physical positions of circuitry failing electrical tests.

FIG. 5A illustrates an example layout of various blocks on a semiconductor chip. The blocks represent the block-level components of a CAD-based design as placed at various positions on the chip 500. For example, block A is placed in the lower-left corner of the chip and includes sub-blocks E, F, G, H and other blocks not shown; block B is placed to the right of block A and includes sub-blocks J, K, L, M and other blocks not shown. Even when the sizes of blocks A and B may be shown as being the same (not the case in FIG. 5A), each of blocks A and B may occupy different size areas, as may blocks E, F, G, H, and J, K, L, and M. It will be appreciated from the teachings below that the invention may be applied to blocks of any number of sizes and non-uniform placement. Other aspects of FIG. 5A are described in the following description of FIGS. 5B and 5C.

The physical positions of elements in the design may be determined from the hierarchy of blocks in the design. FIG. 5B illustrates an example of a hierarchy 534 of blocks for block A of FIG. 5A down to the level of associated memory cells. The hierarchical relationship may be determined from a CAD database. Block A (box 536) is at level 1 and includes children blocks E (538), F (540), G (542), H (544) and other blocks not shown, and is positioned at chip-relative coordinates (0, 0). In one embodiment, the lower-left position on chip 500 is used as the origin for the chip-relative coordinates of the lower-left corner of a level-1 block. For example, the chip-relative x-y coordinates of block A are (0, 0) as shown in FIG. 5A.

Each of the level-2 blocks that is a child of a level-1 block is placed within the level-1 block at a position that is designated with block-relative x-y coordinates. For example, block E is placed within block A at block-relative x-y coordinates (0, 0), block F is placed within block A at (80, 0), block G is placed within block A at (0, 70), and block H is placed within block A at (80, 70).

Each level-2 block (boxes 538, 540, 542, and 544 in the hierarchy 534) has one or more children cells with which is associated information that indicates a cell's logic address and associated block-relative coordinates. It will be appreciated that the logic address includes an identifier assigned by the logic design to identify a memory cell, for example a cell name. Box 546 represents the collection of cells that are children of the level-2 block E, with an example cell placed within block E (block 522 of FIG. 5A) at block-relative x-y coordinates (0, 0). Similarly, block 524 (FIG. 5A) represents a cell that is a child (box 548) of level-2 block F, and block 526 represents a cell that is a child (box 550) of level-2 block G.

Depending on whether an individual cell is mixed with logic, the cell may or may not be defined in CAD data. However, the lowest level block that contains a memory cell may be determined, and therefrom the physical memory structure of which the cell is a part may be determined from the CAD data. Example CAD data includes names of blocks, positions of parent blocks of child blocks, logic address information, and circuit path names. It will be appreciated that logic address information and position information may be generated by place-and-route other tools after the design is synthesized.

FIG. 5C illustrates the hierarchy 560 of blocks related to example block B of FIG. 5A. Block B (box 562) is at level 1 and includes children blocks J (564), K (566), L (568), M (570) and may include blocks that are not shown. Block B is positioned at chip-level x-y coordinates (1000, 0). FIG. 5A further illustrates the placement of block B.

Block J is placed within block B at block-relative x-y coordinates (0, 0), block K is placed within block B at block-relative x-y coordinates (120, 0), block L is placed within block B at block-relative x-y coordinates (0, 80), and block M is placed within block A at block-relative x-y coordinates (120, 60).

Each level-2 block (boxes 564, 566, 568, and 570 in the hierarchy) has one or more children circuit paths. The children circuit paths of the level-2 blocks 564, 566, and 568 are represented as blocks 572, 574, and 576, respectively. Each child circuit path is identified by name and the CAD tool maintains associated block-relative coordinates of the circuit path. Box 572 represents the collection of circuit paths that are children of the level-2 block J, with one path placed within block J at block-relative x-y coordinates (20, 20). Block 582 in FIG. 5A illustrates the placed path. Similarly, block 584 (FIG. 5A) represents a path that is a child (box 574) of level-2 block K, and block 586 represents a path that is a child (box 576) of level-2 block L.

Figure 6:
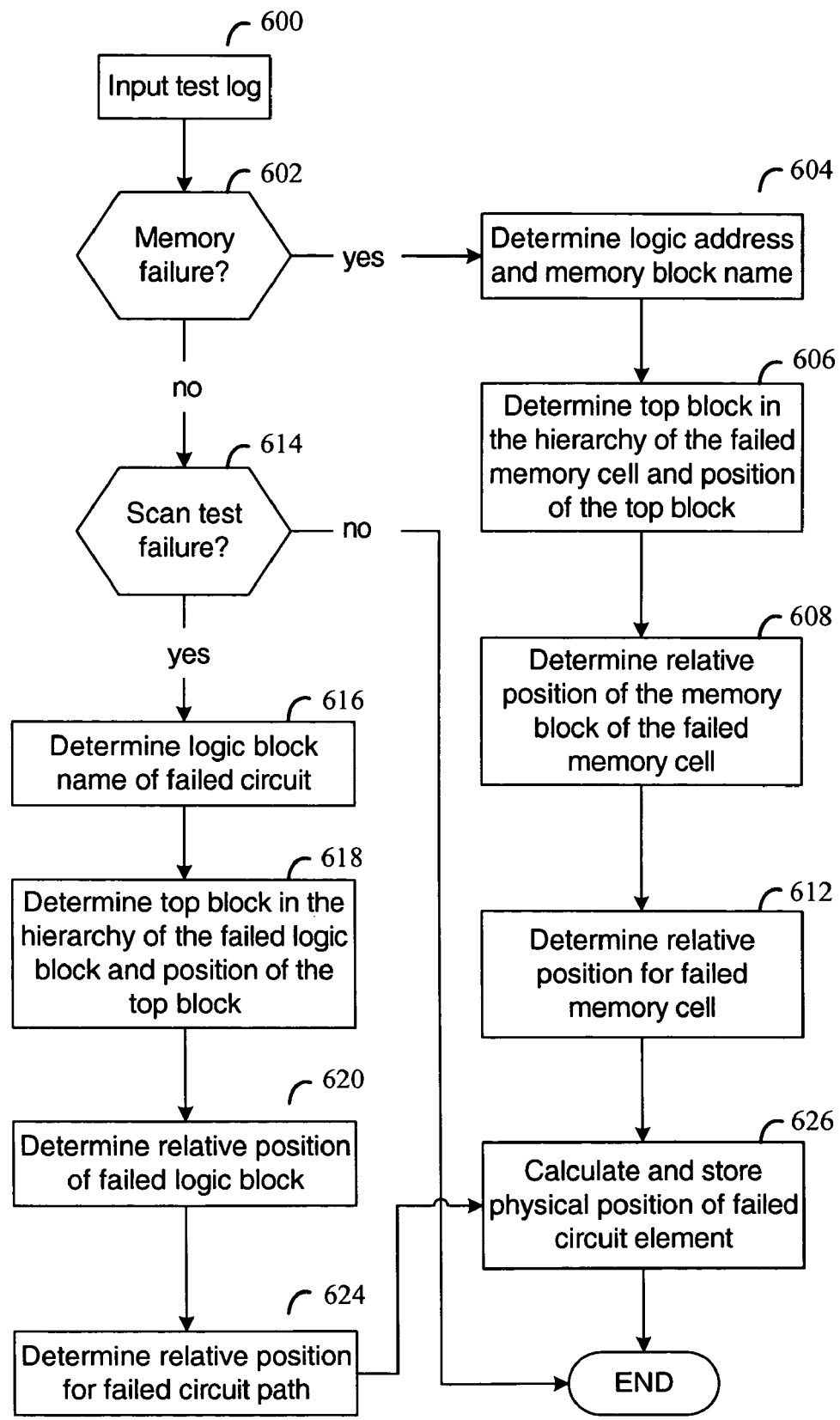
FIG. 6 is a flowchart of an example process for determining the physical position(s) of circuitry that failed an electrical test in accordance with various embodiments of the invention.

FIG. 6 is a flowchart of an example process for determining the physical position(s) of circuitry that failed an electrical test in accordance with various embodiments of the invention. The process follows one path for memory cell failures and another path for scan test failures. Each path generally determines the position of the failing cell based on the logic address or name of the failed circuit path and the position information of the cell and related cells in the hierarchy.

The input raw test data (step 600) may generally include the clock cycle number and the vector for which a failure was detected. This raw data may be analyzed to determine the particular memory cell or circuit path that failed, given that each vector is generally designed to test specific circuitry.

The type of failure may be determined from the type of test pattern used. That is, different test patterns may be used for logic scan tests versus memory cell tests. Generally, the scan test is performed first if the target circuit is also used in performing a memory test. If there is no shared circuit between a scan test and a memory test, the tests could be performed at the same time and different input/output paths used to determine which test failed. The test results are interpreted using the failing clock cycle number and vector number to determine failure of a memory cell versus failure of a scan test.

For a memory cell failure (decision step 602), the process initially determines the logic address (i.e., memory cell name) of the failed memory cell, and from the logic address the associated block name (step 604). The logic address, for example, the cell name, may be determined from the clock cycle number and test vector from the input test log. Because each test vector is designed to test one or more memory cells in particular at specific clock cycles, the logic address may be determined from test information. The logic address associated with the failed memory cell may be used to determine the block name of the failed memory cell from a table of block names and associated logic addresses maintained by modified CAD information (not shown). The original CAD information does not include a link for each failing cell to each level block. The modified CAD information is a look-up table, which is generated from the original CAD information by adding the link of relationship of each memory cell to the multi-level blocks. The look-up table links the logic address and relative physical location information of the multi-level blocks. There are multiple tables to cover each level, including a table for the lowest level in which memory cells reside.

The hierarchy (e.g., FIG. 5B) is upwardly scanned from the block name of the failed memory cell to determine the top block, along with the relative position of the top block (step 606). For example, the chip-relative physical x-y coordinates of the top block A are determined to be (0, 0).

The process then determines the relative position of the memory block of the failed memory cell (step 608). For example, if the failed memory cell is cell 522 (FIG. 5A), then the memory block of the failed memory cell is block E, which in FIG. 5B is hierarchy block 538 that indicates that block E is at block-relative x-y coordinates (0, 0). The relative position of the failed cell may be determined from logic address of the failed memory cell and the hierarchy (step 612). For example, if block 522 of FIG. 5A is the failed memory cell, the logic address may be used to identify the cell under block 538 of FIG. 5B, and the information of box 546 consulted to determine the block-relative x-y coordinates (0, 0) of the cell in the block.

Using the position of the top block, the relative position of the failed memory block, and the relative position of the failed memory cell, the physical position of the failed memory cell is calculated and stored (step 626). The physical position may be computed as the sum of these positions since the coordinates of the top block may be used as the base, the coordinates of the failed block used as offsets from the base coordinates, and the coordinates of the failed memory cell used as offsets from the coordinates of the failed block. For example, if the failed memory cell is block 522 of FIG. 5A, the position is (0, 0). It will be appreciated that the position determined for block 582 would be (1020, 20).

For a scan test failure (decision step 614), the process determines the logic block name of the failed circuit (step 616) from the failing clock cycle # and vector #, as described above. For example, if the failing circuit name is that from box 576 (FIG. 5C), then the associated logic block is logic block L, which is represented by box 568 in FIG. 5C. The top block in the hierarchy of the failed block is then determined along with the position of the top block (step 618). As shown in FIG. 5C, the top logic block may be determined from the CAD tool block hierarchy information. For example, the top logic block of logic block L is logic block B, having chip-relative x-y coordinates (1000, 0) (see box 562 in FIG. 5C).

The process then determines the relative position of the failed logic block (step 620). Continuing the example above, the block-relative x-y coordinates of logic block L are (0, 80). The name of the failed circuit is then used to determine the block-relative x-y coordinates of the failed circuit within the logic block (step 624). For example, the failed circuit name may be that identified by box 576, which has block-relative x-y coordinates in block L of (10, 30).

Using the chip-relative position of the top block, the block-relative position of the failed logic block, and the block-relative position of the failed circuit, the physical position of the failed circuit is calculated and stored (step 626). For example, the position of failed circuit 586 would be (x=1000+0+10, y=0+80+30), or (1010, 110). The saved physical position information may then be correlated with the physical defect data as described above in association with FIG. 1.

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of systems for testing integrated circuits and has been found to be particularly applicable and beneficial in identifying correspondences between physical test failures and electrical test failures. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for analyzing defect data produced in testing a semiconductor chip from a logic design, comprising:
   inputting a first data set that identifies a first set of physical locations associated with defects detected during fabrication of the chip;
   inputting a second test data set that includes one or more identifiers associated with failing circuitry in the chip;
   determining a second set of physical locations from the one or more identifiers of failing circuitry, hierarchical relationships between blocks of the logic design, and placement information associated with the blocks, wherein each of the one or more identifiers is associated with at least one of the blocks; and
   identifying correspondences between physical locations in the first data set and the second set of physical locations.

2. The method of claim 1, wherein the first data set is in a first format further comprising:
   formatting in a third test data set that is compatible with the first format of the first data set, data that indicate physical locations associated with defects described by the second test data set; and
   comparing the first data set to the third test data set.

3. The method of claim 1, further comprising determining a block associated with the failing circuitry from a logic address if the failing circuitry is a memory cell.

4. The method of claim 1, further comprising determining a block associated with the failing circuitry from a circuit name if the failing circuitry is a circuit path.

5. The method of claim 1, further comprising:
   determining for each identifier in the second test data set a block that is associated with the failing circuitry;
   determining a position of the block;
   determining at least one physical location in the second set of physical locations from placement information of ancestor blocks of the block.

6. The method of claim 5, further comprising determining the block associated with the failing circuitry from a logic address if the failing circuitry is a memory cell.

7. The method of claim 5, further comprising determining the block associated with the failing circuitry from a circuit name if the failing circuitry is a circuit path.

8. A method for testing a semiconductor chip, comprising:
   inspecting the semiconductor chip for defects and storing an inspection data set that identifies a first set of physical locations associated with defects detected during inspection;
   testing circuit paths on the semiconductor chip, and storing a test data set that includes one or more identifiers associated with failing circuitry in the semiconductor chip;
   determining a second set of physical locations of defects described by the test data set from the one or more identifiers of failing circuitry, hierarchical relationships between blocks of a design, and placement information associated with the blocks, wherein each of the one or more identifiers is associated with at least one of the blocks; and
   identifying correspondences between physical locations in the inspection data set and the second set of physical locations.

9. The method of claim 8, wherein at least a portion of the inspecting step is performed before fabrication of the semiconductor chip is complete.

10. The method of claim 8, wherein the inspection data set is in a first format further comprising:
    formatting in a second test data set that is compatible with the first format of the inspection data set, data that indicate the physical locations in the second set; and
    comparing the inspection data set to the second test data set.

11. The method of claim 8, further comprising determining a block associated with the failing circuitry from a logic address if the failing circuitry is a memory cell.

12. The method of claim 8, further comprising determining a block associated with the failing circuitry from a circuit name if the failing circuitry is a circuit path.

13. The method of claim 8, further comprising:
    determining for each identifier in the test data set a first block that is associated with the failing circuitry;
    determining the position of the first block;
    determining each physical location in the second set of physical locations from placement information of ancestor blocks of the first block.

14. The method of claim 13, further comprising determining a block associated with the failing circuitry from a logic address if the failing circuitry is a memory cell.

15. The method of claim 13, further comprising determining a block associated with the failing circuitry from a circuit name if the failing circuitry is a circuit path.

16. An apparatus for analyzing defect data produced in testing a chip from a design, comprising:
    means for inputting a first data set that identifies a first set of physical locations associated with defects detected during fabrication of the chip;
    means for inputting a second test data set that includes one or more identifiers associated with failing circuitry in the chip;
    means for determining a second set of physical locations from the one or more identifiers of failing circuitry, hierarchical relationships between blocks of the design, and placement information associated with the blocks, wherein each of the one or more identifiers is associated with at least one of the blocks; and
    means for identifying correspondences between physical locations in the first data set and the second set of physical locations.

* * * * *